(12) United States Patent
Kawamura

(10) Patent No.: US 8,597,873 B2
(45) Date of Patent: Dec. 3, 2013

(54) METHOD FOR PATTERN FORMATION

(75) Inventor: Yoshihisa Kawamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/592,635

(22) Filed: Aug. 23, 2012

(65) Prior Publication Data

US 2013/0137268 A1     May 30, 2013

(30) Foreign Application Priority Data

Nov. 28, 2011    (JP) ................................ 2011-259294

(51) Int. Cl.
*G03F 7/26*         (2006.01)

(52) U.S. Cl.
USPC .......................................................... 430/322

(58) Field of Classification Search
USPC ......................................... 430/322, 323, 394
See application file for complete search history.

(56) References Cited

U.S. PATENT DOCUMENTS

| | | | |
|---|---|---|---|
| 7,026,099 B2 | 4/2006 | Kato et al. | |
| 7,994,053 B2 | 8/2011 | Park et al. | |
| 8,187,797 B2 | 5/2012 | Shiobara et al. | |
| 2003/0215749 A1 | 11/2003 | Kato et al. | |
| 2010/0104984 A1 | 4/2010 | Shiobara et al. | |
| 2011/0049548 A1 | 3/2011 | Park et al. | |
| 2011/0195189 A1 | 8/2011 | Kawamura | |

FOREIGN PATENT DOCUMENTS

| | | |
|---|---|---|
| JP | 2003-316019 | 11/2003 |
| JP | 2005-43420 | 2/2005 |
| JP | 2008-244259 | 10/2008 |
| JP | 2010-103415 | 5/2010 |
| JP | 2010-287621 | 12/2010 |
| JP | 2011-51875 | 3/2011 |
| JP | 2011-165855 | 8/2011 |

*Primary Examiner* — Brittany Raymond
(74) *Attorney, Agent, or Firm* — Finnegan, Henderson, Farabow, Garrett & Dunner, L.L.P.

(57) ABSTRACT

According to one embodiment, a method for pattern formation comprises forming a first pattern on a first region of a processed film, forming a reverse material film, having a photosensitive compound, on the processed film so that the reverse material film covers the first pattern, exposing and developing the reverse material film and processing the reverse material film into a second pattern in a second region different from the first region on the processed film, applying etch-back, after exposing and developing the reverse material film, to the reverse material film to expose an upper surface of the first pattern and processing the reverse material film into a third pattern in the first region, and etching the processed film using the second pattern and the third pattern as masks.

14 Claims, 3 Drawing Sheets

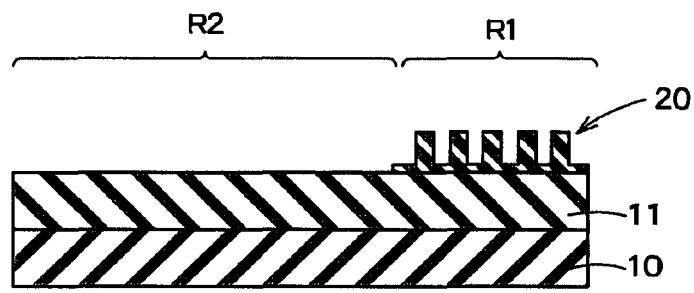
F I G. 1
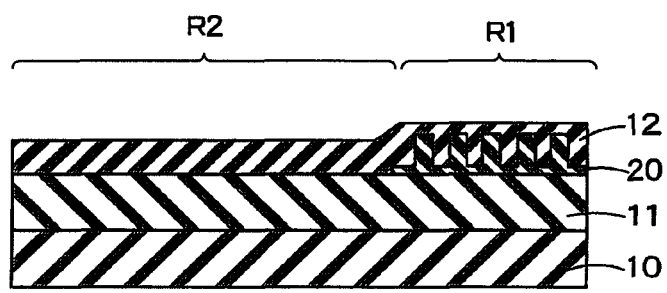
F I G. 2
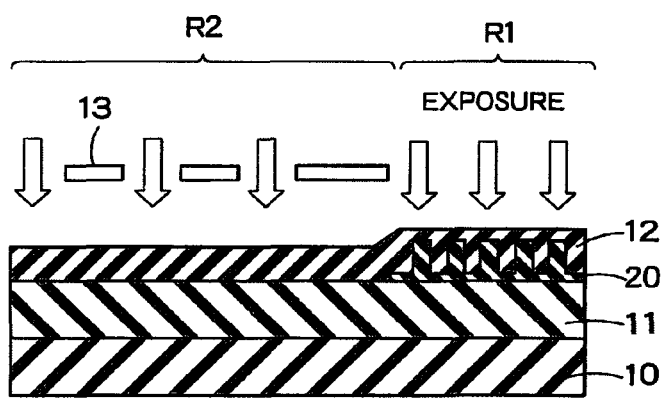
F I G. 3

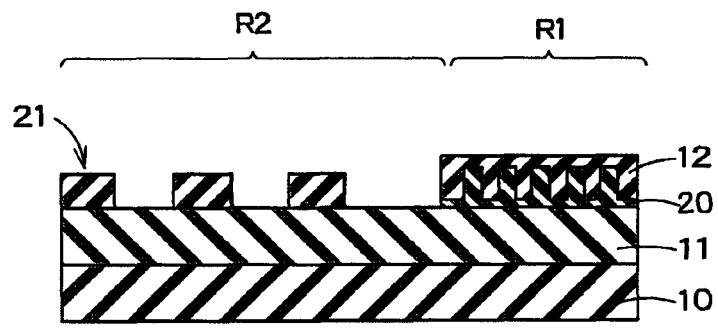
F I G. 4
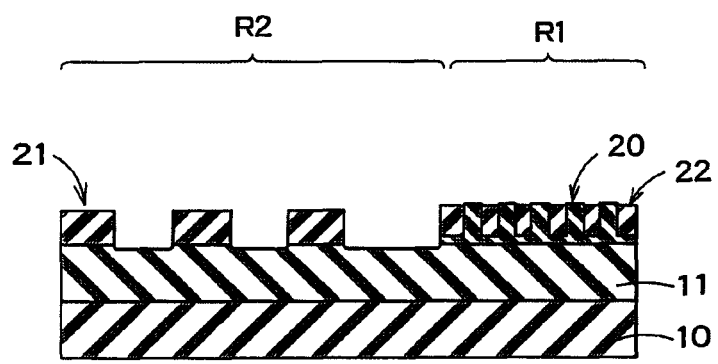
F I G. 5
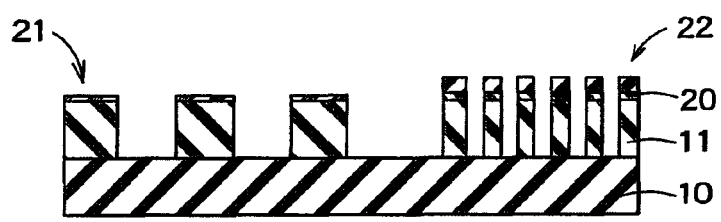
F I G. 6

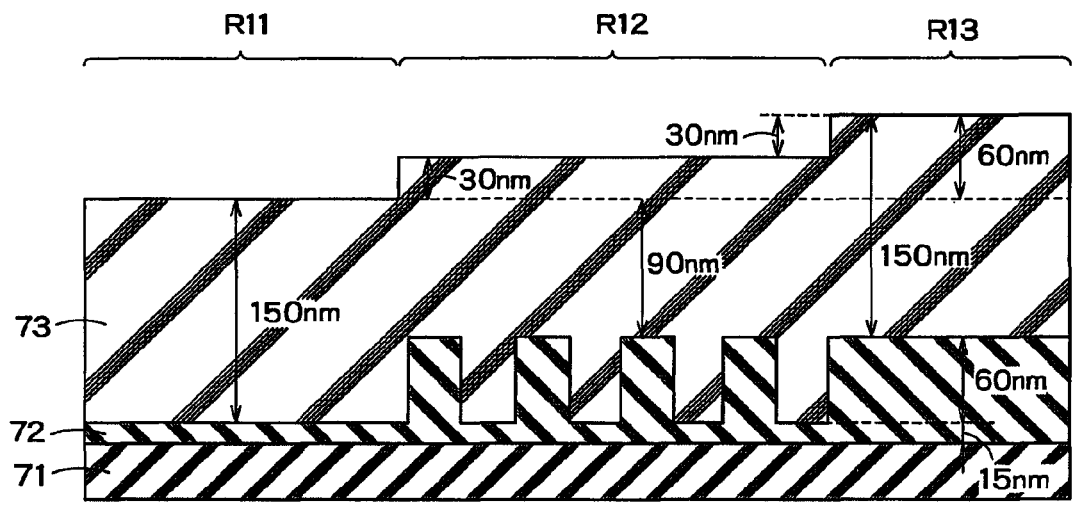
F I G. 7
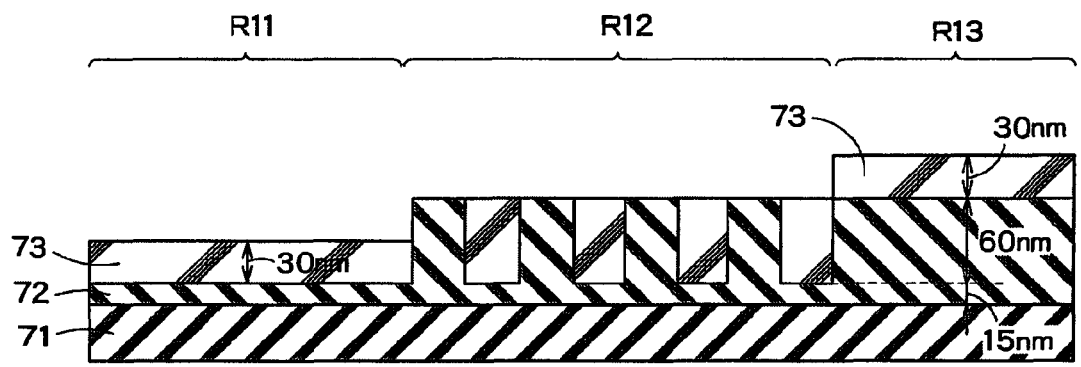
F I G. 8
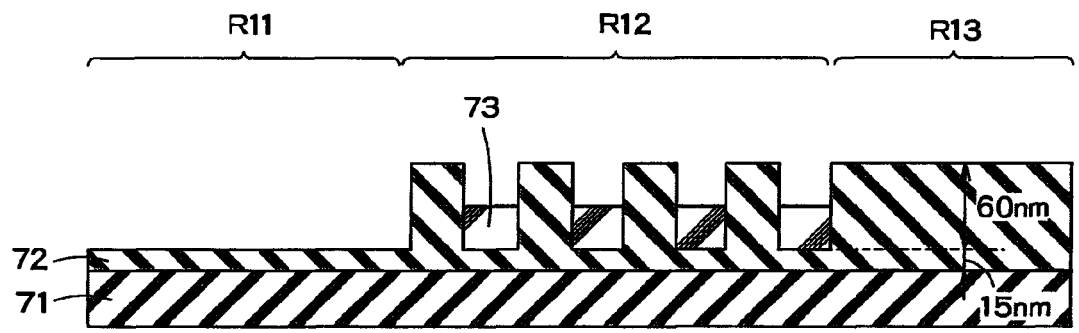
F I G. 9

METHOD FOR PATTERN FORMATION

CROSS REFERENCE TO RELATED APPLICATION

This application is based upon and claims benefit of priority from the Japanese Patent Application No. 2011-259294, filed on Nov. 28, 2011, the entire contents of which are incorporated herein by reference.

FIELD

Embodiments described herein relate generally to a method for pattern formation.

BACKGROUND

Recently, along with miniaturization of a semiconductor device, resist film thickness is getting smaller in a lithography process. If the resist film thickness is reduced, it is difficult to directly process a processed film using a resist pattern as a mask. As a method for solving this problem, a multilayer resist process such as a reverse mask process has been proposed. In the reverse mask process, a reverse material is coated onto a resist pattern, and the reverse material is subjected to etch-back to expose an upper surface of the resist pattern. Then, dry etching using the reverse material as a mask is performed to remove the resist pattern, and, thus, to form a reverse pattern. By virtue of the use of the reverse pattern as a mask, the processed film can be processed into a pattern in which the resist pattern is reversed.

In the above conventional reverse mask process, a level difference corresponding to a resist pattern coverage (ratio of concave and convex portions) is formed on the coated reverse material. When the reverse material on which the coating level difference is formed is subjected to etch-back, there are problems that the reverse material remains in a region from which the reverse material is to be removed, the reverse material in a region where the reverse material is to be remained is removed, or a processed film cannot be processed into a desired pattern.

Thus, it has been studied that the coating level difference of the reverse material is reduced by arrangement of a dummy pattern and a design rule limitation. However, the arrangement of the dummy pattern is difficult in design, or there is a problem that a design flexibility is reduced due to a strict design rule limitation, and the coating level difference of the reverse material interferes with application of a reverse mask process.

BRIEF DESCRIPTION OF THE DRAWINGS

FIG. 1 is a process cross-sectional view for explaining a method for pattern formation according to the present embodiment;

FIG. 2 is a process cross-sectional view subsequent to FIG. 1;

FIG. 3 is a process cross-sectional view subsequent to FIG. 2;

FIG. 4 is a process cross-sectional view subsequent to FIG. 3;

FIG. 5 is a process cross-sectional view subsequent to FIG. 4;

FIG. 6 is a process cross-sectional view subsequent to FIG. 5;

FIG. 7 is a process cross-sectional view for explaining a method for pattern formation according to a comparative example;

FIG. 8 is a process cross-sectional view subsequent to FIG. 7; and

FIG. 9 is a process cross-sectional view subsequent to FIG. 8.

DETAILED DESCRIPTION

According to one embodiment, a method for pattern formation comprises forming a first pattern on a first region of a processed film, forming a reverse material film, having a photosensitive compound, on the processed film so that the reverse material film covers the first pattern, exposing and developing the reverse material film and processing the reverse material film into a second pattern in a second region different from the first region on the processed film, applying etch-back, after exposing and developing the reverse material film, to the reverse material film to expose an upper surface of the first pattern and processing the reverse material film into a third pattern in the first region, and etching the processed film using the second pattern and the third pattern as masks.

Embodiments will now be explained with reference to the accompanying drawings.

FIGS. 1 to 6 are process cross-sectional views for explaining a method for pattern formation according to the present embodiment.

As shown in FIG. 1, a processed film 10 is formed on a silicon substrate (not shown). The processed film 10 is, for example, a silicon oxide film with a thickness of 200 nm. Then, a lower layer film (resist) 11 is formed on the processed film 10. The lower layer film 11 is, for example, a coating carbon film (SOC: Spin on Carbon) with a thickness of 150 nm.

Subsequently, in a region R1, a pattern 20 is formed on the lower layer film 11 by an imprint process. In the imprint process, for example, a plurality of droplets of acrylic photo-curable resin of approximately 10 pl are dropped on the lower layer film 11 by an ink jet method. Then, a concave/convex pattern surface of a template is brought into contact with the photo-curable resin to fill the photo-curable resin in the concave/convex pattern. Subsequently, light is applied to cure the photo-curable resin, and then the template is removed, whereby the pattern 20 is obtained. The thickness of a residual layer of the pattern 20 formed by the imprint process is determined by the total amount of the dropped photo-curable resin.

For example, the pattern 20 is a line and space pattern with a pitch of 30 nm, the height is 75 nm, and the pattern coverage is approximately 50%. The pattern coverage is a ratio of the convex portions of the concave/convex pattern, and the pattern coverage of 50% means that the ratio of the convex portions to the concave portions is half and half. In a region R2 with no pattern 20, since there, is no convex portion, the pattern coverage is 0%. The residual layer formed by the imprint process may be formed on the region R2.

The region R1 is a region where a minute pattern is formed and, for example, a memory cell region in a semiconductor memory device. In this case, the region R2 with no pattern 20 is a peripheral circuit region, for example.

Next, as shown in FIG. 2, a reverse material 12 is coated on the lower layer film 11 and the pattern 20. For example, the reverse material 12 is a negative-type material mainly composed of photosensitive polysilane and is rotated and coated to have a thickness of 100 nm. After coating with the reverse material 12, the reverse material 12 is baked at approximately 160° C. to increase the intensity, and, thus, to increase resistance against an etching process to be performed later.

At this time, in the reverse material 12, although a coating level difference d is formed between the region R1 and the region R2, the coating level difference d is formed between the region R1 with a pattern coverage of 50% and the region R2 with a pattern coverage of 0%, and therefore, the coating level difference d is small.

In view of processing resistance, it is preferable that the reverse material 12 contains at least one of SI atoms, Ge atoms, Sn atoms, Ag atoms, and Au atoms. Specifically, there can be used photosensitive polysilane, photosensitive polygermane, photosensitive polystannane, photosensitive polysilazane, photosensitive polysiloxane, photosensitive polycarbosilane, photopolymerizable Si-containing acrylic monomer, Si-containing novolak resin, Si-containing PHS resin, and a copolymer and a mixture of two or more these compounds.

A material with which a cross-linking reaction is progressed by irradiation with UV light or the like may be used in the reverse material 12. In this case, baking of the reverse material 12 can be omitted, and heat resistance of the lower layer film 11 is not required. As the material with which the cross-linking reaction is progressed by light irradiation, silsesquioxane (SSQ) such as hydrogen silsesquioxane (HSQ) and acylated silsesquioxane can be used, for example.

Next, as shown in FIG. 3, the reverse material 12 is exposed using a photo mask 13. The photo mask 13 is used for pattern formation in the region R2. Exposed polysilane is photocrosslinked to be insoluble in a developer. The region R1 is exposed entirely.

Subsequently, as shown in FIG. 4, development is performed, the reverse material 12 in an unexposed portion is removed, and a first reverse material pattern 21 is formed in the region R2. Since the region R1 is exposed entirely, the pattern 20 is covered with the reverse material 12. The first reverse material pattern 21 is a line and space pattern, for example.

Subsequently, as shown in FIG. 5, the reverse material 12 is subjected to etch-back by RIE (reactive ion etching) to expose an upper surface of the pattern 20, whereby a second reverse material pattern 22 constituted of the reverse material 12 is formed in the region R1. The second reverse material pattern 22 is a pattern obtained by inverting concave and convex portions of the pattern 20 and has a narrower pitch (is more minute) than the first reverse material pattern 21.

Subsequently, as shown in FIG. 6, a portion where the upper surface of the pattern 20 is exposed and the lower layer film 11 are processed by oxygen RIE, using the first reverse material pattern 21 and the second reverse material pattern 22 as masks.

Thereafter, the processed film 10 is processed by RIE, using the patterned lower layer film 11 as a mask. Then, unnecessary photo-curable resin is converted into ash by oxygen plasma. According to this constitution, a silicon oxide film pattern with a line and space pattern having a pitch of 30 nm and a height of 200 nm can be formed in the region R1. A pattern corresponding to the first reverse material pattern 21 formed in the lithography process in FIGS. 3 and 4 can be formed in the region R2.

According to the present embodiment, the reverse pattern of the minute pattern formed by the imprint process is formed using the reverse material 12, and a pattern other than the minute pattern is formed by the lithography process using the reverse material 12. Thus, the reverse pattern of the pattern formed by the imprint process and the pattern formed by the lithography process are used as masks, whereby a processed film can be processed into a desired pattern.

Comparative Example

FIGS. 7 to 9 are process cross-sectional views for explaining a method for pattern formation using a reverse mask process according to a comparative example.

As shown in FIG. 7, a reverse material 73 is coated on a resist pattern 72 on a processed film 71. The pattern coverage of the resist pattern 72 in a region R11 is 0%, the pattern coverage of the resist pattern 72 in a region R12 is 50%, and the pattern coverage of the resist pattern 72 in a region R13 is 100%. Namely, the region R11 has no convex of the resist pattern 72, and the region R13 has no concave of the resist pattern 72. The film thickness of the resist pattern 72 in the region R11 is 15 nm, and the height of the convexes of the resist pattern 72 is 60 nm.

When a reverse material 73 is coated onto the resist pattern 72 so as to have a film thickness of 150 nm, as shown in FIG. 7, the reverse material 73 with a film thickness of 150 nm is coated in the regions R11 and R13. Since in the region R12 the reverse material 73 enters into concaves of the resist pattern 72, the reverse material 73 has a thickness of 120 nm as viewed from the upper surfaces of the convexes. Thus, as shown in FIG. 7, a coating level difference of 30 nm is formed between the region R11 and the region R12, a coating level difference of 30 nm is formed between the region R12 and the region R13, and a coating level difference of 60 nm is formed between the region R11 and the region R13.

When the reverse material 73 on which the above coating level differences are formed is subjected to etch-back to expose the upper surface of the resist pattern 72 in the region R12, as shown in FIG. 8, the reverse material 73 with a film thickness of approximately 30 nm remains in the region R13. When the reverse material 73 remains above the convex portions of the resist pattern 72, the processed film 71 cannot be processed into a desired pattern.

When the reverse material 73 is subjected to etch-back so as not to remain in the region R13, as shown in FIG. 9, the reverse material 73 in the region R11 is removed. When the reverse material 73 does not remain in the concave portions of the resist pattern 72, the processed film 71 cannot be processed into a desired pattern.

As described above, in the method for pattern formation according to the comparative example, when the reverse mask process is applied to the resist pattern 72 in which the pattern coverage is distributed from 0% to 100%, a level difference corresponding to the pattern coverage is formed on the reverse material 73. Thus, the reverse material 73 remains in the region R13 from which the reverse material 73 is to be removed, and the reverse material 73 in the region R11 where the reverse material 73 is to be remained is removed, so that a desired pattern cannot be formed.

Meanwhile, in the present embodiment, a minute pattern is processed using as a mask a reverse pattern of a pattern formed by the imprint process, and a non-minute pattern such as a peripheral circuit pattern is processed using as a mask a pattern formed by the lithography process in which a reverse material having photosensitivity is used. Thus, the coating level difference of the reverse material is reduced, and a desired pattern can be formed.

For example, when a processed film is processed into a pattern corresponding to the resist pattern 72 of FIG. 7 by the method for pattern formation according to the present embodiment, the region R12 which becomes a minute pattern is processed using as a mask a reverse pattern of a pattern formed by the imprint process, and the regions R11 and R13 are processed using as a mask a pattern formed by the lithography process in which a photosensitive reverse material is used. Thus, it is possible to prevent the formation of large coating level differences such as those of the reverse material 73 of FIG. 7.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method for pattern formation comprising:
    forming a first pattern on a first region of a processed film;
    forming a reverse material film, having a photosensitive compound, on the processed film so that the reverse material film covers the first pattern;
    exposing and developing the reverse material film and processing the reverse material film into a second pattern in a second region different from the first region on the processed film;
    applying etch-back, after exposing and developing the reverse material film, to the reverse material film to expose an upper surface of the first pattern and processing the reverse material film into a third pattern in the first region; and
    etching the processed film using the second pattern and the third pattern as masks.

2. The method for pattern formation according to claim 1, wherein the first pattern is formed by an imprint process.

3. The method for pattern formation according to claim 1, wherein the first pattern, the second pattern, and the third pattern are line and space patterns, and the first pattern and the third pattern have a narrower pitch than the second pattern.

4. The method for pattern formation according to claim 1, wherein when the reverse material film is processed into the second pattern, the first pattern is covered with the reverse material film.

5. The method for pattern formation according to claim 1, further comprising baking the reverse material film after forming the reverse material film and before exposing the reverse material film.

6. The method for pattern formation according to claim 1, wherein the photosensitive compound contains at least one of Si atoms, Ge atoms, Sn atoms, Ag atoms, and Au atoms.

7. The method for pattern formation according to claim 1, wherein the photosensitive compound contains photosensitive polysilane, photosensitive polygermane, photosensitive polystannane, photosensitive polysilazane, photosensitive polysiloxane, photosensitive polycarbosilane, photopolymerizable Si-containing acrylic monomer, Si-containing novolak resin, or Si-containing PHS resin.

8. The method for pattern formation according to claim 1, wherein the first region is a memory cell region, and the second region is a peripheral circuit region.

9. A method for pattern formation comprising:
    forming a first pattern in a first region on a processed film;
    forming, on the processed film, a reverse material film having a material, with which a cross-linking reaction is progressed by light irradiation, so that the reverse material film covers the first pattern;
    exposing and developing the reverse material film and processing the reverse material film into a second pattern in a second region different from the first region on the processed film;
    applying etch-back, after exposing and developing the reverse material film, to the reverse material film to expose an upper surface of the first pattern and processing the reverse material film into a third pattern in the first region; and
    etching the processed film using the second pattern and the third pattern as masks.

10. The method for pattern formation according to claim 9, wherein the first pattern is formed by an imprint process.

11. The method for pattern formation according to claim 9, wherein the first pattern, the second pattern, and the third pattern are line and space patterns, and the first pattern and the third pattern have a narrower pitch than the second pattern.

12. The method for pattern formation according to claim 9, wherein when the reverse material film is processed into the second pattern, the first pattern is covered with the reverse material film.

13. The method for pattern formation according to claim 9, wherein the first region is a memory cell region, and the second region is a peripheral circuit region.

14. The method for pattern formation according to claim 9, wherein the material contains silsesquioxane.

* * * * *